United States Patent [19]

Sanders et al.

[11] 4,416,966
[45] Nov. 22, 1983

[54] CAPSULAR IMAGING SYSTEM COMPRISING DECOLORIZING AGENT

[75] Inventors: Frederick W. Sanders; Richard F. Wright; Paul C. Adair, all of Chillicothe, Ohio

[73] Assignee: The Mead Corporation, Dayton, Ohio

[21] Appl. No.: 411,721

[22] Filed: Aug. 25, 1982

[51] Int. Cl.³ .................. G03C 7/00; G03C 1/40; B41L 1/20
[52] U.S. Cl. .................. 430/138; 430/211; 430/235; 430/374; 430/541; 282/27.5
[58] Field of Search .......... 430/138, 211, 235, 374, 430/541; 282/27.5

[56] References Cited

U.S. PATENT DOCUMENTS

| | | |
|---|---|---|
| 2,953,454 | 9/1960 | Berman .................. 430/138 |
| 3,072,481 | 1/1963 | Berman et al. .......... 430/138 |
| 3,090,687 | 5/1963 | Berman .................. 430/138 |
| 3,111,407 | 11/1963 | Lindquist et al. ...... 430/138 |
| 3,116,148 | 12/1963 | Miller .................... 430/138 |
| 3,202,510 | 8/1965 | Hollmann ............... 430/138 |
| 3,219,446 | 11/1965 | Berman .................. 430/138 |
| 3,272,629 | 9/1966 | Hollis .................... 430/138 |
| 3,700,439 | 10/1972 | Phillips .................. 430/138 |
| 3,736,139 | 5/1973 | Yamashita et al. ..... 430/338 |
| 3,892,569 | 7/1975 | Speers ................... 430/138 |
| 4,101,690 | 7/1978 | Miyamoto et al. ..... 282/27.5 |
| 4,149,887 | 4/1979 | Levy ..................... 430/46 |

FOREIGN PATENT DOCUMENTS

| | | |
|---|---|---|
| 44-1773369 | 8/1969 | Japan . |
| 49-6212 | 2/1974 | Japan .................. 430/138 |
| 52-3448877 | 9/1977 | Japan . |
| 53-951978 | 1/1978 | Japan . |
| 53-952078 | 1/1978 | Japan . |
| 57-124343 | 8/1982 | Japan . |
| 1001832 | 8/1965 | United Kingdom . |
| 1058798 | 2/1967 | United Kingdom . |
| 1141475 | 1/1969 | United Kingdom . |
| 1193923 | 6/1970 | United Kingdom . |

OTHER PUBLICATIONS

Modern Photography, "What's Ahead?", Varden, Lloyd E., p. 86, 1958.

Primary Examiner—Richard L. Schilling
Attorney, Agent, or Firm—Biebel, French and Nauman

[57] ABSTRACT

A capsular imaging system wherein the imaging material comprises a support coated on one surface with a layer of capsules containing, as an internal phase, a radiation sensitive composition and a decolorizing agent; images are formed by a dry process wherein the aforesaid sheet is image-wise exposed; exposure of the sheet controls release of the decolorizing agent from the capsules which image-wise reacts with a dye layer and causes a color change. Embodiments are also disclosed in which the decolorizing agent inhibits or reverses the color forming reaction between a dye precursor and a dye developer.

16 Claims, 10 Drawing Figures

CAPSULAR IMAGING SYSTEM COMPRISING DECOLORIZING AGENT

BACKGROUND OF THE INVENTION

The present invention relates to a dry imaging system wherein the sensitized medium is contained in a layer of capsules.

More particularly, the present invention relates to an imaging sheet provided on one surface with a layer of capsules having a radiation sensitive internal phase containing a decolorizing agent which is associated with a layer of a background dye; wherein images are formed by image-wise exposing the imaging sheet to actinic radiation and rupturing the capsules such that an exposure-controlled, image-patterned release of the decolorizing agent occurs, the decolorizing agent thereafter reacting, image-wise, with the dye layer to form images in the form of colored and uncolored or pale areas.

The present invention also relates to an imaging system in which the aforesaid imaging sheet is associated with a dye precursor and a dye developer in which the decolorizing agent is released as above and reverses or inhibits the color-forming reaction.

Imaging systems based on encapsulated photosensitive systems are known.

Berman, U.S. Pat. No. 3,219,446 discloses a transfer imaging process in which an azo-blue "B" black dye is encapsulated with a cross-linkable polymer or a polymerizable monomer as fluid-droplets dispersed in a binder layer or fluid droplets contained in a layer of microcapsules. As described, imaging is accomplished by image-wise exposing a layer of the encapsulated dye to electromagnetic radiation. In the exposed areas the encapsulated fluid droplets are hardened by exposure and the dye cannot transfer to a copy sheet. In the unexposed areas, the fluid droplets remain fluid and the dye is transferred to the copy sheet in the form of an image.

Phillips, U.S. Pat. No. 3,700,439 discloses a photocopy process wherein Michler's ketone is encapsulated in a conventional manner and provided as a layer on a support. Michler's ketone itself is not a color former, but patterned irradiation of the ketone in the capsules produces a latent image of colorless, acid-colorable, dye precursor from the ketone. Images are developed by rupturing the capsules and contacting irradiated and non-irradiated ketone with an acid developer. Upon contact with the acid developer, the irradiated ketone produces a visible image. Phillips discloses both a system wherein the exposed imaging sheet is calendered face-to-face with an acid-coated receiving sheet to form images and a self-contained system wherein the acid developer is on the same surface as the capsule coating.

Berman et al, U.S. Pat. No. 3,072,481 discloses another type of encapsulated light sensitive element which utilizes a light-sensitive material which is readily converted to a colored form by irradiation when carried in a liquid vehicle but which is insensitive when solid. By encapsulating such a material with a volatile solvent, image-wise exposing a layer of the encapsulate, and rupturing the capsules to evaporate the solvent, an image is obtained in the exposed areas whereas the non-image areas are fixed by evaporation of the solvent.

Forris, U.S. Pat. No. 3,001,873, discloses a more complex system wherein the walls of capsules containing a solid dye are photosensitized such that patterned exposure renders the capsules unswellable. By wetting the sheet and heating, the unexposed capsules are swollen and rendered rupturable whereas the dye is immobilized in the exposed areas. Thereafter, by rupturing the swollen capsules in contact with a receiving sheet, image-wise transfer of the dye occurs from the unexposed areas only.

SUMMARY OF THE INVENTION

One object of the present invention is to provide a dry, low cost imaging system wherein the imaging material comprises a support coated on one surface with a layer of capsules containing an internal phase, a radiation sensitive composition and a decolorizing agent wherein images are formed by exposure-controlled release of the decolorizing agent from the plurality of capsules such that the decolorizing agent image-wise reacts with a background dye and forms an image.

Another object of the present invention is to provide an imaging system wherein a decolorizing agent so released inhibits, prevents or reverses the color-forming reaction of a dye precursor and a dye developer such that images are formed.

Another object of the present invention is to provide a low cost imaging system of the above types which is capable of producing images with high resolution.

Still another object of one embodiment of the present invention is to provide an imaging sheet which is dry processable and does not require expensive apparatus for exposure or development.

A further object of the present invention is to provide an imaging sheet and an imaging process whereby printed documents can be copied inexpensively.

These and other objects are attained in accordance with the present invention which provides an imaging sheet comprising a support having on one surface thereof a layer of capsules containing a radiation sensitive composition and a decolorizing agent as the internal phase, the aforementioned sheet having in association therewith a background dye or a combination of a dye precursor and a dye developer which is capable of forming a background dye.

In accordance with the present invention images are formed by a process which comprises image-wise exposing the aforementioned imaging sheet to actinic radiation, rupturing the capsules containing the radiation sensitive composition and decolorizing agent such that the capsules release the decolorizing agent in an image pattern and the decolorizing agent reacts with the associated background dye or inhibits or reverses the reaction between the dye precursor and the dye developer to produce a color difference which forms an image. Thus, in accordance with the present invention, the reactivity of the internal phase is such that one obtains exposure-controlled release of the decolorizing agent from the capsules and the reaction of the decolorizing agent is patterned after the image. Images are formed by the color change produced by the decolorizing agent in the background dye or by tonal differences in the dye produced upon reaction of the dye precursor and dye developer.

The radiation sensitive compositions used in the present invention may be photohardenable compositions which are cured or polymerized upon exposure, or they may be photosoftenable compositions which depolymerize or otherwise decrease in molecular weight upon exposure. The former compositions are more common and give rise to a negative working imaging sheet and process.

In the case of photohardenable compositions, initially the internal phase of the capsules containing the decolorizing agent is fluid or semi-fluid. Image-wise exposure of a layer of the capsules hardens the internal phase and prevents the release of the decolorizing agent. In the exposed areas, solidification of the internal phase is believed to render the capsules unrupturable, or the capsules are believed to rupture but the decolorizing agent becomes immobilized in the photohardened internal phase in approximate proportion to the degree of exposure. In the unexposed areas, the internal phase remains fluid and readily releases its decolorizing agent when the capsules are ruptured in approximately inverse proportion to the degree of exposure. Thus, in the case of photohardenable compositions, upon image-wise exposing the capsules and rupturing them, the decolorizing agent is released from the capsules in the unexposed areas and negative images in the form of a color change or lightening of the background dye are produced.

Photosoftenable compositions operate on the opposite mechanism. Exposure softens or renders fluid the internal phase of the initially solid or semi-solid capsules such that the decolorizing agent is released from the exposed areas upon capsule rupture. Photosoftenable compositions are, therefore, positive-working.

The imaging sheet of the present invention may be associated with the layer of background dye in a number of different ways. The dye layer may be present on the same support and surface as the capsules containing the radiation sensitive composition and decolorizing agent, or the dye layer may be present on a separate sheet to which the decolorizing agent is transferred after exposure and capsule rupture. In the former embodiment, the dye and the capsules containing the radiation sensitive composition may be mixed in one layer if the dye does not interfere with exposure of the capsules. Alternatively, the capsules and the dye may be in separate layers, the dye layer usually underlying the capsule layer so as not to interfere with its exposure.

Where the dye is carried on a transfer sheet, the invention process involves the additional steps of assembling the imaging sheet and the transfer sheet and transferring the decolorizing agent released from the capsules to the transfer sheet for the image-forming reaction with the background dye. In the most typical case, the imaging sheet is exposed, assembled with the transfer sheet, and passed through the nip between two pressure rollers whereupon the capsules are ruptured and their contents is transferred to the transfer sheet corresponding to the exposure. Thus, in the case where the photohardenable composition is used, the decolorizing agent would be transferred from the unexposed capsules.

In other embodiments of the invention, the background dye which forms the image is formed by the reaction of a dye presursor and a dye developer. Dye precursors and dye developers conventionally used in so called carbonless paper may be used in the present invention. Various constructions of the imaging sheet are possible. For example, the dye precursor and the dye developer may be carried on the imaging sheet, or the dye precursor may be carried on the imaging sheet and the dye developer on a transfer sheet or vice versa. The particular construction that is desirable will depend in some cases on whether the decolorizing agent principally reacts with the dye developer or the dye precursor.

DETAILED DESCRIPTION OF THE INVENTION

FIGS. 1-4 A and B illustrate four representative embodiments of the invention. Referring to FIG. 1A, the invention imaging sheet 10 comprises a support 12 having a dye layer 14 and a capsule layer 16 coated in that order on the surface thereof. The capsule layer 16 is made up of a plurality of pressure rupturable capsules 18 comprising a solid wall 20 which envelops a fluid, photohardenable internal phase 22 which comprises a radiation sensitive composition and a decolorizing agent.

While the invention is illustrated in FIGS. 1-4 using an imaging sheet having discrete capsules, it is to be understood that the term "capsule" as used herein includes both systems in which the capsule is formed with the discrete wall and so called resin dispersion or open phase systems in which the internal phase containing the radiation sensitive composition and decolorizing agent is dispersed as droplets throughout a dispersing medium or binder. The former systems are typified by encapsulating the decolorizing agent in a layer of microcapsules. Furthermore, while the capsules are described herein as being "pressure rupturable" it is to be understood that this is a description of the nature of the capsules themselves and does not limit the process whereby the capsules are ruptured. Thus, while the capsules are pressure rupturable, means other than pressure may be used to rupture them in accordance with the invention.

Figure 1A:
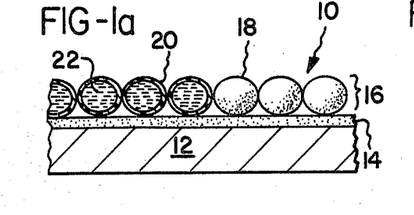
FIGS. 1A, 2A, 3A, and 4A illustrate imaging sheets and the associated background dye layers in accordance with the present invention.

In addition to the aforementioned embodiment of the invention, embodiments are also possible in which the dye in layer 14 and the capsules 18 in layer 16 are mixed in a single layer, provided, of course, that the dye does not interfere with exposure of the radiation sensitive composition in the capsules 18. Depending upon the nature of the dye and the exposure radiation used, it is also possible for the dye layer 14 to overcoat the capsule layer 16.

Figure 5A:
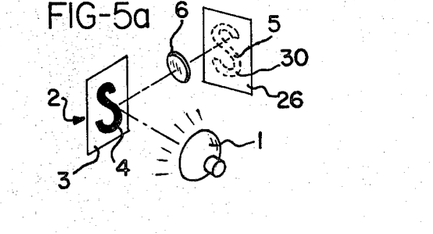
FIGS. 5A and 5B schematically illustrate the invention process.
Figure 5B:
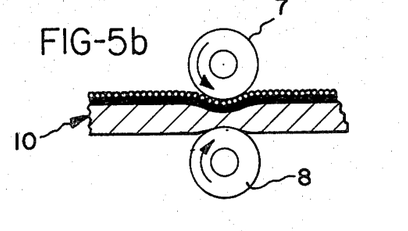

Exposure and development of the imaging sheet 10 are shown in FIGS. 5A and 5B. Therein, the sheet 10 is exposed by reflection imaging. Incident actinic radiation, such as ultraviolet light from a source 1 is reflected from an original 2 having light background areas 3 and dark printed areas 4 through a suitable lens system 6. Radiation from the source 1 is reflected from the light areas 3 and absorbed by the dark areas 4. This results in a latent image 5 in the form of exposed areas 26 and unexposed areas 30 in the sheet 10.

Following exposure, as shown in FIG. 5B the sheet 10 is passed through the nip formed between a pair of pressure rolls 7 and 8 whereupon the capsules in the unexposed areas 30 rupture and release the decolorizing agent contained therein.

Figure 1B:
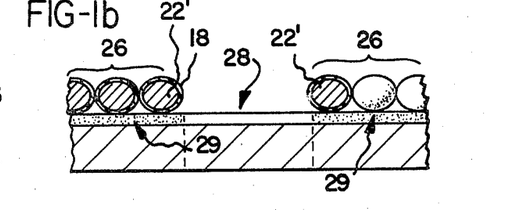
FIGS. 1B, 2B, 3B and 4B are cross-sectional representations of the invention imaging sheets following exposure and development.

Referring to FIG. 1B, the capsules 18 in exposed areas 26 are shown as having a solid internal phase 22' which, as discussed above, does not release the decolorizing agent. In the unexposed area 30, the internal phase is not hardened by exposure, and, upon development, the capsules (no longer shown) are ruptured and the decolorizing agent migrates to the underlying dye layer 14 where, in FIG. 1B, the decolorizing agent renders the dye layer colorless or pale in the area 28, thereby giving rise to an image formed by the difference in color between the area 28 and the area 29 in which the dye layer 14 is unchanged.

Half tone areas are also possible where, as a function of the degree of exposure incident a given area on the imaging sheet, the capsules in that area release a portion of the decolorizing agent. For example, the number of capsules which rupture in areas 26 and 30 may be a function of the degree of exposure, or the amount of decolorizing agent released from a given ruptured capsule may be a function of the degree of exposure. Alternatively and most likely, a combination of both of the above occurs to produce half tones. Thus, while not shown, all or a portion of the capsules in the exposed areas 26 may also rupture but release the decolorizing agent in proportion to the exposure. The exact mechanism by which the release of the decolorizing agent is image-wise controlled in the present invention is not known with certainty.

Figure 2A:
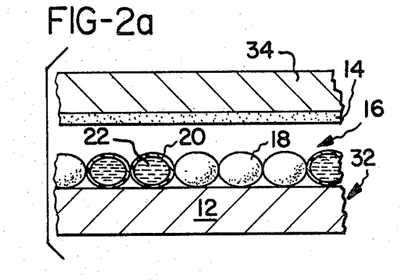
Figure 2B:
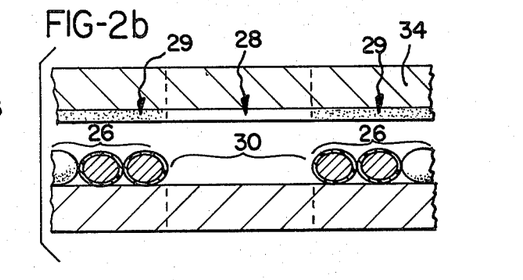

FIG. 2A illustrates an imaging sheet in accordance with the present invention wherein an imaging sheet 32 comprises a support 12 and a capsule layer 16 containing capsules 18 having a capsule wall 20 and a fluid internal phase 22. In the embodiment illustrated in FIG. 2A, the dye layer 14 is carried on a transfer sheet 34. Following exposure of the imaging sheet 32 to actinic radiation, typically, the imaging sheet 32 is assembled with the transfer sheet 34 with the dye layer 14 in face-to-face contact with capsule layer 16 and the two sheets in combination are passed through a pressure nip formed between a pair of pressure rolls to rupture the capsules in a manner analogous to FIG. 5. Thus, after the imaging sheet has been exposed and passed through the pressure nip, the capsules remain intact in the exposed areas 26. In the unexposed area 30, where the internal phase of the capsules is not hardened, the capsules rupture and release their contents to the dye layer 14 on transfer sheet 34 where, in the area 28 corresponding to the unexposed area 30, the decolorizing agent renders the dye colorless or changes the color of the dye and a negative image is formed which contrasts with background areas 29.

Figure 3A:
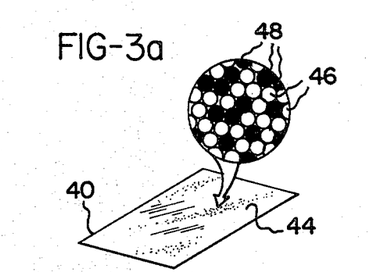

Referring to FIG. 3A, herein is illustrated an embodiment of the invention wherein the background dye is formed by the reaction of a dye precursor and a dye developer material. In FIG. 3A, the imaging sheet 40 comprises a support 42 (FIG. 3B), a capsule layer 44 and a layer 54 (FIG. 3B) of a developer material. The capsule layer 44 comprises a mixture of capsules 46 (light) containing a dye precursor and capsules 48 (dark) containing the radiation sensitive composition and decolorizing agent. Capsules 48 include a solid wall 49 (FIG. 3B) which, as in the previously discussed embodiments, encapsulates a fluid photohardenable internal phase 52 (FIG. 3B).

Figure 3B:
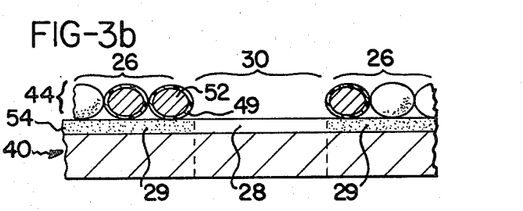

Imaging sheet 40 is image-wise exposed to form exposed areas 26 and unexposed area 30 as in FIG. 3B. A uniform pressure is then applied across the surface of the sheet which simultaneously ruptures the capsules 46 containing the dye precursor and the capsules 48 containing the radiation sensitive composition in the unexposed area 30. The capsules 46 release the dye precursor which, under the applied pressure, is transferred to the developer layer 54 where it reacts with the dye developer material and forms the background dye color. In the unexposed areas 30, the decolorizing agent also transfers to the developer layer 54 where it inhibits or reverses the dye-forming reaction. Analogous to the previous embodiments, in the exposed areas 26 in the internal phase 52 of the capsules 48 is hardened such that the decolorizing agent is not released and transferred to the dye layer 54, thus an image is formed in area 28 which contrasts with the background dye in area 29.

Various modifications of the embodiment illustrated in FIGS. 3A and 3B are possible. For example, developer layer 54 may be carried on a transfer sheet and imaging may be accomplished similar to as in FIGS. 2A and B by simultaneously transferring the dye precursor and image-wise transferring the decolorizing agent to the transfer sheet for image-formation.

As a third version of the FIG. 3 system, the dye developer may be interdispersed among the mixed capsules in layer 56 instead of being in a separate layer.

Figure 4A:
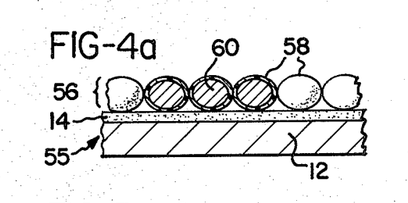

FIGS. 4A and B illustrate an imaging sheet of the invention analogous to the imaging sheet in FIGS. 1A and B wherein the capsules 18 contain a photosoftenable internal phase. Referring to FIG. 4A, the imaging sheet designated 55 comprises a support 12 and a dye layer 14. Dye layer 14 is overcoated with a layer 58 of capsules 58 containing a semi-solid photosoftenable internal phase 60. Exposure and development is carried out as in FIGS. 5A and 5B except, upon exposure, the capsules in the exposed areas 26 are softened such that they rupture and release the decolorizing agent whereas the capsules in the unexposed area 30 do not release the decolorizing agent.

Figure 4B:
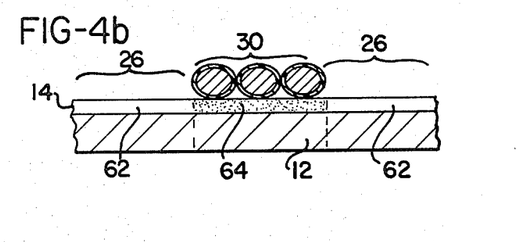

For purposes of illustration only, the capsules in area 30 in FIG. 4B are shown as not being ruptured. Again the exact mechanism by which the release of the decolorizing agent is controlled is not known with certainty and the above explanation of the photohardenable system applies equally to the photosoftenable compositions but in reverse. After development, the dye layer 14 contains bleached or otherwise color-changed areas 62 corresponding to the exposed areas 26 and background dye areas 64 corresponding to unexposed areas 30.

The support used in the imaging sheet of the present invention may be commercial or special grade paper or a transparent or translucent polymeric film. For example, the support may be commercial impact raw stock, cast-coated paper, chrome rolled paper, or a transparent film such as polyethylene terephthalate.

It may be particularly desirable to use a transparent or translucent support in the imaging sheet illustrated in FIGS. 2–4A and 2B as an imaging sheet constructed on a transparent support can be pre-assembled with the transfer sheet and exposed from the side opposite the capsule coated surface. In the embodiment illustrated in FIGS. 2A and B, if the support is not transparent or translucent and the imaging sheet is exposed from the capsule bearing side of the sheet, the transfer image is the mirror image of the latent image, and optics must be provided to reverse the real image upon exposure. Where exposure is from the opposite side of support 12, however, the transfer image is the same as the latent image and such optical reversal is not necessary.

The imaging sheet of the present invention can be made sensitive to various forms of radiation and, as such, the term "actinic radiation" as used herein includes the full spectra of electromagnetic radiation including ultraviolet, infrared, the entire visible spectrum, as well as X-ray and ion beam radiation. The preferred forms of actinic radiation are ultraviolet radiation and visible light having a wavelength of about 190–800 nm and, more preferably, 380–480 nm (the blue spectrum). Ultraviolet systems are desirable because they can be handled in room light for sufficiently long periods of time to permit the imaging sheet to be removed from a light-shielding package and installed in an exposure apparatus without incorporating auxiliary shielding elements into the imaging sheet. One problem with ultraviolet sensitivity, however, is that many of the papers on which documents are printed contain optical brighteners or $TiO_2$, which absorb ultraviolet radiation and, therefore, cannot be copied using ultraviolet radiation by reflection imaging. Blue light sensitivity is advantageous because it avoids the optical brightener problem and it is possible to build temporary screening means into the imaging sheet for room light handleability as discussed below.

In the preferred embodiments of the present invention, the radiation sensitive composition contains a radiation polymerizable material. Preferred materials are ethylenically unsaturated compounds and, more particularly, compounds having two or more ethylenically unsaturated terminal groups. Representative examples of the latter compounds include ethylenically unsaturated acid esters of polyhydric alcohols such as polyethylene diacrylate, polypropylene diacrylate, trimethylolpropane triacrylate, etc.

Another preferred radiation curable material is an acrylate prepolymer derived by the partial reaction of pentaerythritol and acrylic acid or acrylic acid esters. Isocyanate modified acrylic, methacrylic and itaconic acid esters of polyhydric alcohols such as disclosed in U.S. Pat. Nos. 3,783,151; 3,759,809; and 3,825,479 to Carlick et al may also be useful as well as some of the curable materials found in radiation curable inks as the photosensitive component.

In addition to the foregoing, polymerizable materials, known photocurable polymers can also be used in the present invention such as polymers conventionally employed in the manufacture of printing plates and photoresists.

Some photosoftenable, radiation de-polymerizable materials are 3-oximino-2-butanone methacrylate which undergoes main chain scission upon ultraviolet exposure and poly (4'-alkyl acylo-phenones). See Reichmanis, E.; *Am. Chem. Soc. Div. Org. Coat. Plast. Chem. Prepr.* 1980, 43, 243–251 and Lukac, I.; Chmela S., *Int. Conf. on Modif. Polym.* 5th, Bratislava, Czech, July 3–6, I.U.P.A.C. Oxford, England, 1979, 1, 176–182. These materials have not been tested but it is believed that they would be useful in the present invention.

The radiation sensitive compositions used in the present invention generally include a photoinitiator. Those skilled in the art will appreciate that various photoinitiators can be selected for use in the present invention depending upon the sensitivity that is desired and the nature of the radiation sensitive composition. The photoinitiators used in the present invention may be compounds which absorb exposure radiation and generate a free radical alone or in combination with a sensitizer which is capable of initiating reaction of the internal phase. The initiators used in the present invention may also be compounds which complex with a sensitizer to produce a free radical generating species.

For ultraviolet sensitivity, one useful photoinitiator is a combination of Michler's ketone (bis-4,4'(dimethylamino) benzophenone) and benzoin methyl ether.

Some typical examples of photoinitiators conventional photosensitive compositions which are also expected to be useful in the present invention are α-alkoxy phenyl ketones, O-acylated- α-oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo- α-phenylacetophenones; photoreducible dye-reducing agent redox couples, halogenated paraffins (e.g., brominated or chlorinated paraffin) and benzoin alkyl ethers. Specific exampnes of these compounds include: α-alkoxyphenyl ketones of the formula I where $R^1$ is a C(1–4) alkyl group (e.g., methyl, ethyl, n-propyl, i-propyl, t-butyl, etc.), $R^2$ is a phenyl group or a substituted phenyl group wherein said substituent is as defined for X below, $R^3$ is hydrogen or a C(1–4) alkyl group, and X is hydrogen, an alkoxy group having 1 to 4 carbon atoms (e.g., methoxy, ethoxy, propyloxy, etc.), a dialkylamino group wherein the alkyl group contains 1 to 4 carbon atoms, a nitro group, a nitroso group, a cyano group, a mercapto group, a chlorine, bromine or iodine atom, an alkyl group having 1 to 4 carbon atoms, an alkenyl group having 1 to 4 carbon atoms, an acyl group, a phenyl group, or a carboalkoxy group having 2 to 5 carbon atoms;

α, α, dialkoxyphenyl ketones of the formula II where $R^1$, $R^2$ and X are defined as in formula I; benzophenones of the formula III where $X^1$ is hydrogen, an amino group, or a dialkylamino group, the alkyl group having 1 to 4 carbon atoms, and Y is hydrogen, an alkyl group having 1 to 4 carbon atoms, an alkoxy group having 1 to 4 carbon atoms, an alkenyl group having 1 to 4 carbon atoms, a phenyl group a substituted phenyl group, a dialkylamino group, a nitro group, a nitroso group, a cyano group, a mercapto group, a chlorine, bromine, or iodine atom, or an acyl group;

1-phenyl-1,2-propanedione-2-O-benzoyloxime, 9,10-phenanthraquinone, 9,10-anthraquinone, xanthone, a chloroxanthone, a chloromethyl xanthone, a chlorosulfonyl xanthone, thioxanthone, a chlorothioxanthone, a chloromethyl thioxanthone, a chlorosulfonyl thioxanthone, chloromethyl naphthalene, chlorosulfonyl naphthalene, chloromethyl anthracene, chlorosulfonyl anthracene, chloromethyl benzoxazole, chloromethyl benzothiazole, chloromethyl benzimidazole, chlorosulfonyl benzoxazole, chlorosulfonyl benzothiazole, chlorosulfonyl benzimidazole, a chloromethyl quinoline, a chlorosulfonyl quinoline, a chloromethyl benzophenone, a chlorosulfonyl benzophenone, a chloromethyl fluorenone, a chlorosulfonyl fluorenone, carbon tetrabromide, benzoin methyl ether, benzoin ethyl ether, desyl chloride, desyl amine, methylene blue/ascorbic acid, chlorinated aliphatic hydrocarbons and combinations thereof.

The sensitivity among the above compounds can be shifted by adding substituents such that the compounds generate radicals when exposed to the desired radiation wavelength.

For visible (blue) light sensitivity, the aforementioned photoinitiators may be combined with a sensitizer such as Michler's ketone or an anologous dialkylamino benzophenone derivative thereof, a substituted coumarin, a linear polyene (e.g., trans B-carotene) or a sensitizing dye, e.g., a yellow dye.

The amount of the photoinitiator may vary. It is generally adjusted depending upon the nature of the radiation sensitive composition to provide a suitable exposure time. Typically, photoinitiators are used in amounts up to 10% by weight based on the weight of the radiation sensitive composition.

The decolorizing agents used in the present invention are compounds which react with a dye to render it colorless, substantially colorless, or to otherwise change its color so as to form a contrasting image on the dye background as described above, or which inhibit or reverse the reaction of the dye developer with the dye precursor. For best results in aqueous phase encapsulation, the decolorizing agent should be low in water solubility, and soluble in the radiation sensitive composition.

One class of decolorizing agents useful in the present invention are bleaching agents which lighten the dye color. Some typical examples of bleaching agents useful in the present invention include 2,2'-bipyridene, adamantanamine, triphenylphosphine, 4,4'-bipyridene and other water-insoluble bases.

Still other compounds useful as decolorizing agents are trisubstituted phosphates such as tricresyl phosphate, trisubstituted citrates such as tricyclohexyl citrate, trisubstituted nitrogen compounds such as dimethylacetylamine and other dimethyl or diethyl fatty amines, polyether glycol esters such as diethylene dibenzoate. Tetraethylene glycol diacrylate, dimethacrylate or dicinnamate; dipropylene glycol diacrylate, ethyleneamine diethylene glycol diacrylate are notable as both decolorants and internal phase reactants.

Another class of decolorizing agent include materials conventionally employed as desensitizers in the carbonless paper art. Some typical examples of these compounds are primary alkylamines such as dodecylamine; quarternary ammonium salts such as dodecyltrimethylammonium chloride; tertiary amines such as monoalkylamine- and aralkylamine- ethonolamineoxide adducts; secondary alkylamines such ad didodecylamine; tertiary amines such as triethylamine; primary arylamines such as aniline, the polyoxyalkyleneamines disclosed in U.S. Pat. No. 4,101,690, the reaction products of $\alpha,\beta$ unsaturated carboxylic acids or unsaturated ketones with amines disclosed in U.S. Pat. No. 4,125,636, etc. Provided these desensitizing agents can be encapsulated and they do not interfere with the reaction of the radiation sensitive composition, they are useful in the present invention.

A two step process may be adpoted when using the foregoing desensitizing agents. Since the desensitizing agent reacts with the dye developer, an imaging sheet containing the desensitizing agent as a decolorizing agent encapsulated with a radiation sensitive composition may first be exposed and then subjected to capsule rupture to thereby image-wise desensitize the dye developer which is carried in a separate layer. Thereafter the image-wise desensitized developer sheet may be passed in contact with a conventional color former sheet through a pressure nip whereupon the color former is uniformly transferred to the image-wise desensitized developer sheet where it reacts with the developer in the areas not desensitized to form an image. Thus, in this case a developer sheet could be image-wise desensitized as shown in FIG. 1 and then contacted with a color former material. On the other hand, if the dye developer is on a separate sheet from the sheet containing the encapsulated desensitizer, two transfers may be involved, first a transfer of desensitizer from the exposed sheet to the developer sheet and, second, a transfer of color former from a conventional CB sheet to the developer sheet.

In most cases, the internal phase is a mixture of the radiation sensitive composition (including the photoinitiator) and the decolorizing agent. The radiation sensitive composition is generally present in an amount of approximately 50 to 99 percent by weight and, more preferably, 90 to 99 percent by weight based on the weight of the internal phase. The decolorizing agent is usually present in an amount of approximately 0.5 to 20 percent and, more preferably, 1 to 10 percent based on the weight of the internal phase. These amounts must be adjusted for the particular radiation sensitive composition and decolorizing agent used to provide the optimum balance of sensitivity, contrast, and tonal quality, required for the particular use.

In addition to the radiation sensitive composition and the decolorizing agent, the internal phase may also include a so-called carrier oil. Carrier oils are conventionally used in carbonless paper and are typically weakly polar solvents having boiling points above 170° C. and preferably in the range of about 180° C. to 300° C. These oils are generally characterized by their ability to dissolve Crystal Violet Lactone in a concentration of 0.5 weight percent or more. The presence of a carrier oil can be advantageous. It may dissolve the dye or dye precursor and thereby speed up its reaction with the decolorizing agent. Typical examples of such carrier oils are alkylated biphenyls (e.g., monoisopropyl biphenyl), polychlorinated biphenyls, castor oil, mineral oil, deodorized kerosene, naphthenic mineral oils, dibutyl phthalate, brominated paraffin, dibutyl fumerate, and mixtures thereof. Alkylated biphenyls are generally less toxic and preferred.

The carrier oil may be used in amount ranging from approximately 0 to 50 percent by weight. Suitable amounts are determined empirically so as to optimize tonal quality.

The radiation sensitive composition containing the decolorizing agent and optional carrier oil can be encapsulated in a conventional manner. One suitable method for encapsulating the internal phase is to disperse a water-immiscible solution of the internal phase constituents in a water miscible solution of the capsule wall forming material and to induce phase separation. In one embodiment of the invention, the internal phase is encapsulated in a urea-formaldehyde wall-former and, more particularly, a urea-resorcinol-formaldehyde wall former in which resorcinol has been added to the wall former to enhance its oleophilicity. Other hydrophilic wall-forming materials which may also be useful in the present invention include gelatin (see U.S. Pat. No. 2,730,456 and 2,800,457 to Green et al) including gum arabic, polyvinyl alcohol, carboxymethyl cellulose; resorcinol-formaldehyde (see U.S. Pat. No. 3,755,190 to Hart et al), isocyanate (see U.S. Pat. No. 3,914,511 to Vassiliades), polyurethane (see U.S. Pat. No. 3,796,669 to Kiritani et al), melamine-formaldehyde resin and hydroxypropyl cellulose. The capsule wall forming material used in a given imaging sheet is selected based on the radiation sensitive composition it envelops. Thus, the formed capsule wall must be transmissive of the actinic radiation.

The mean size of the capsules used in the present invention may vary over a broad range but generally ranges from approximately 1 to 25 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 3 to 15 microns and particularly approximately 3 to 10 microns.

In addition to microencapsulated systems described above, so called open phase systems which can be prepared by dispersing an oil solution of the internal phase constitutents in a solution of a polymeric binder and adjusting the viscosity of the dispersion for coating are also useful. Among a wide variety of materials which may be used as binders in open phase systems, gelatin, polyvinyl alcohol, polyacrylamide, and acrylic latices are representative examples.

The term "dye" as used with reference to the present invention includes coloring material in general and, more specifically, non-pigmentary coloring matter. Still more specifically, the dyes used in the present invention are organic compounds containing chromophores such as leuco dyes, etc. Suitable dyes for use in the present invention include Crystal Violet Lactone, Copikem V, Copikem XX (trademarks of Hilton Davis, Cincinnati, Ohio), with an acid dye developer, etc.

The dye may be coated directly from solution on the support of the imaging sheet or the transfer sheet, or the dye may be dispersed in a binder and this composition coated on the support. Any film forming binder can be used provided it permits the dye to react with the decolorizing agent. The amount of dye used will vary with the color quality of the particular dye.

As described above, the background dye may be formed by reacting a dye precursor which reacts with a developer material to generate a dye. Many of the dye precursors conventionally used in carbonless paper are useful in the present invention. In general, these materials are colorless electron donating compounds. Representative examples of such dye precursors include substantially colorless compounds having in their partial skeleton a lactone, a lactam, a sultone, a spiropyran, an ester or an amido structure. Specifically, there are triarylmethane compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran,
3-methyl-2, 2'-spirobi(benzo-f-chrome),
3,3-bis (p-dimethylaminophenyl)phthalide,
3-(p-dimethylaminophenyl)-3-(1,2 dimethylindole-3-yl) phthalide,
3-(p-dimethylaminophenyl)-3-(2-methylindole-3-yl)-phthalide,
3-(p-dimethylaminophenyl)-3-(2-phenylindole-3-yl)-phthalide,
3,3-bis (1,2-dimethylindole-3-yl)-5-dimethylaminophthalide,
3,3-bis-(1,2-dimethylindole-3-yl)-6-dimethylaminophthalide,
3,3-bis-(9-ethylcarbazole-3-yl)-5-dimethylaminophthalide,
3,3-bis(2-phenylindole-3-yl)-5-dimethylaminophthalide,
3-p-dimethylaminophenyl-3-(1-methylpyrrole-2-yl)-6-dimethylaminobenzhydrin benzyl ether,
N-halophenyl leuco Auramine,
N-2,4,5-trichlorophenyl leuco Auramine,
Rhodamine-B-anilinolactam,
Rhodamine-(p-nitroanilino)lactam,
Rhodamine-B-(p-chloroanilino)lactam,
3-dimethylamino-6-methoxyfluoran,
3-diethylamino-7-methoxyfluoran,
3-diethylamino-7-chloro-6-methylfluroan,
3-diethylamino-6-methyl-7-anilinofluoran,
3-diethylamino-7-(acetylmethylamino)fluoran,
3-diethylamino-7-(dibenzylamino)fluoran,
3-diethylamino-7-(methylbenzylamino)fluoran,
3-diethylamino-7-(chloroethylmethylamino)fluoran,
3-diethylamino-7-(diethylamino)fluoran,
3-methyl-spiro-dinaphthopyran,
3-ethyl-spiro-dinaphthopryan,
3,3'-dichloro-spiro-dinaphthopyran,
3-benzyl-spiro-dinaphthoypyran,
3-methyl-naphtho-(3-methoxybenzo)-spiropyran,
3-propyl-spirodibenzoidipyran, etc. Mixtures of the foregoing dye precursors can also be used in the present invention.

In addition to the foregoing dye precursors fluoran compounds such as disclosed in U.S. Pat. No. 3,920,510 can be used to produce the background dye. In addition, organic compounds capable of reacting with heavy metal salts to give colored metal complexes, chelates or salts can be adapted for use in the present invention.

The dye precursors used in the present invention are reacted with a dye developer material to generate the background dye. This reaction may be carried out as part of the preparation of the imaging sheet or transfer sheet in which case the dye precursor may simply be coated on a layer of dye developer and reacted in situ; or the reaction may be carried out as part of the development process in which case the dye precursor may be encapsulated in a conventional manner. Alternatively, the dye precursor need not be encapsulated in a discrete capsule but may be dispersed in a suitable matrix such that upon contacting the imaging sheet under pressure the dye precursor contacts the dye developer and images are formed by the image-wise reaction of the decolorizing agent.

It is convenient to use the encapsulated dye precursor by mixing discrete capsules containing the dye precursor with capsules containing the radiation sensitive internal phase. For this reason, it is desirable to encapsulate the dye precursor and the radiation sensitive internal phase in the same wall forming material such that dispersions of the capsules in the same carrier liquid can be mixed and coated on a support to form the invention imaging sheet. The amounts in which the two types of capsules are mixed will depend upon on the amount of dye precursor and decolorizing agent encapsulated therein. In most cases, the amount of active agent contained in the capsules will be such that the capsules can be used in approximately equal amounts. The dye precursor containing capsules and the radiation sensitive decolorizing agent capsules can be coated in separate layers on the support of the imaging sheet if desired.

The developer materials conventionally used in carbonless paper technology can generally be used in the present invention. Generally, these materials are characterized as electron accepting materials. Illustrative examples include clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins (e.g., see U.S. Pat. Nos. 3,672,935; 3,732,120 and 3,737,410) such as zinc modified oil soluble pheonol-formaldehyde resin zinc carbonate, etc. and mixtures thereof. To the extent necessary for complete disclosure of these materials, the above noted patents are specifically incorporated by reference. One developer commonly employed is a combination of kaolin and phenolic resin.

When used as a developer transfer sheet in a transfer imaging process, the dye developer may be mixed with a binder such as latex, polyvinyl alcohol, maleic anhydride-styrene copolymer, starch and gum arabic and coated on the transfer sheet. It is to be understood that binders well known as film-forming materials can be used in this capacity.

The developer material may also be incorporated in the imaging sheet to form a so-called self-contained imaging sheet. In accordance with the latter embodiment of the invention, the developer material typically is coated on the imaging sheet support and underlies the layer of capsules containing the dye precursor. The teachings in U.S. Pat. No. 4,010,292 may be used to prepare self-contained sheets for use in the present invention.

The imaging sheets and transfer sheets of the present invention can be prepared in a conventional manner by coating the respective compositions on a support using such coating techniques as roller coating or blade coating followed by drying.

In making copies of printed documents, it has been found desirable to use a blue-light sensitive imaging sheet. Using a blue-light sensitive material, it is possible to make the system handleable in room light by incorporating in the system a fugitive yellow filter dye which is bleached or otherwise rendered inactive or removed from the imaging system prior to exposure. The yellow dye absorbs blue-light and prevents an imaging material from being exposed as it is removed from a light-shielding package and installed in an exposure apparatus. The fugitive dye may be incorporated in the imaging system in a separate layer which overcoats the layer of the encapsulated radiation sensitive material or the fugitive dye may be fixed in the capsule wall of a microcapsule having a discrete wall. Yellow fugitive dyes are well known in the art. Dyes such as thermally bleachable dyes which can be inactivated or removed from the imaging system with ease are preferred. Using thermally bleachable dyes, the imaging material is heated in the exposure apparatus to a temperature at which the dye is bleached prior to exposure. Thereafter, the imaging material can be exposed by the application of light in the visible blue range. In addition to thermally bleachable fugitive dyes, the invention is also open to the use of dyes which are bleached by oxidation. Although, using the latter dyes, a liquid processing step would normally be required to bleach the dye.

Room light handleability of visible light sensitive systems can also be achieved by adjusting the sensitivity of the radiation sensitive composition such that a more intense exposure is required to activate the system.

Self-contained copy sheets which are subjected to pressure to rupture the capsules preferably include a layer which prevents removal of the capsule coating as the self-contained sheet is passed through a pressure nip. Such a coating is referred to as a non-blocking layer and may be formed of any film-forming polymer which transmits the exposure radiation. Representative examples of suitable non-blocking layers include polyvinyl acetate, etc.

Imaging sheets embodying the invention imaging system can be exposed and developed using a fairly simple exposure apparatus. In its simplest form for reflection imaging, the apparatus requires only a radiation source, means of focusing the exposure radiation from the original onto the imaging sheet and means for rupturing the encapsulate. Simplified means such as this can be used with the invention because development is essentially a dry process wherein the decolorizing agent reacts with the dye layer in only the infintesimal droplets encapsulated as the internal phase.

While the invention has been described with reference to pressure development wherein a pressure is applied to the capsules to rupture them, in some applications other means of rupturing the capsules may also be used. For example, the capsules can be ruptured by exposing them to ultrasonic vibration or solvent vapor. While it is usually sufficient to simply rupture the capsules in the presence of the developer to develoop the images, in some cases development can be hastened or image density intensified by mildly heating the sheet, e.g., for one minute at a temperature of about 100° C. or less.

The invention is illustrated in more detail by the following non-limiting example.

EXAMPLE 1

Capsules containing 2,2'-bipyridine as a decolorizing agent and a photopolymerizable monomer were prepared as follows:

26.9 g of 17.1% isobam, 50 g water and 30.8 g of 10% gum arabic were mixed to produce Part A. This mixture was heated to 60° C. and 8.3 g of urea and 0.8 g of resorcinol were added thereto after adjusting the pH to 4 with drop-wise addition of sulfuric acid. 50 g of TMPPA, 2.5 g benzophenone, 0.28 g Michler's Ketone, and 10 g 2,2'-bipyridene were mixed to provide a Part B. Part A was poured into a blender and Part B was added to Part A with rapid mixing over a period of 45 seconds. 21.4 ml formalin was added to the mixture which was then stirred at a lower speed for 2 hours at 60° C. This mixture was transferred to a beaker equipped with a propellor stirrer. Ammonium sulfate in an amount of 0.6 g and 62.2 g water was added to the mixture which was then stirred to one hour at 60° C. The pH was then adjusted to 9. Sodium bisulfite in an amount of 2.8 g was added to the mixture which was then cooled to room temperature.

Acid forms of two dyes were produced by coating solutions of 1 g of each dye in 20 g acetone on a sheet of paper pre-coated with a phenolic resin dye developer. The dyes used were Copikem X and Copipkem IV, both of which are products of Hilton Davis, Cincinnati, Ohio. The sheets coated with Copikem X were blue whereas the sheets coated with Copikem IV were black.

The capsules containing 2,2'-bipyridene prepared as above were coated on the sheets with a No. 10 Meyer Rod. The sheets were then exposed 10 minutes to a U.V. lamp through a photomask whereafter the sheet was passed through the nip between a pair pressure rolls for development. The blue sheet prepared from the Copikem X dye possessed a D max of 0.72 and D min of 0.45. The black sheet prepared from Copikem IV possessed D max of 1.09 and D min of 0.47.

EXAMPLE 2

Capsules containing 2,2'-bipyridene prepared as in Example 1 were mixed with urea-formaldehyde capsules containing Copikem X color former. The mixture of capsules was coated on a Transrite dye developer sheet manufactured by Mead Corporation. This sheet was exposed through a mask for 10 minutes to a U.V. lamp. The sheet was developed by passing it through a pressure nip and heating at 100° C. for one minute. A blue negative image was obtained having D max of 0.29 and D min of 0.16.

Having described the invention in detail and by reference to specific embodiments thereof, it will be understood that numerous variations and modifications are possible without departing from the scope of the invention defined in the following claims.

What is claimed is:

1. An imaging system comprising:
   an imaging sheet and
   a background dye or a combination of a dye precursor and a dye developer which react to form a background dye,
   said imaging sheet including:
   a support,
   a plurality of capsules in a layer on one surface of said support, and
   an internal phase contained within said capsules comprising a decolorizing agent and a photohardenable or photosoftenable radiation sensitive composition,
   wherein images can be formed by image-wise exposing said sheet to actinic radiation and rupturing said capsules such that said decolorizing agent is image-wise released from said capsules and reacts with said associated background dye to decolorize it or inhibits, prevents or reverses the color forming reaction of said dye precursor and dye developer to produce a color difference in the form of an image.

2. The image system of claim 1 wherein said radiation sensitive composition is a photohardenable composition.

3. The imaging system of claim 2 wherein said photohardenable composition contains a radiation curable monomer.

4. The imaging system of claim 1 wherein said system comprises said background dye and said dye is carried on said imaging sheet in a layer contiguous with said layer of capsules, and said decolorizing agent released from said capsules reacts with said dye to decolorize it and thereby form an image.

5. The imaging system of claim 1 wherein said system comprises said background dye and additionally comprises a transfer sheet and said dye is carried in a layer on the surface of said transfer sheet, and said decolorizing agent released from said capsules is transferred to said transfer sheet where it reacts with said dye to decolorize it and thereby form an image.

6. The imaging system of claim 1 wherein said system comprises said combination of said dye precursor and said dye developer and said dye precursor is contained in a plurality of capsules which are codeposited on said surface of said support in the same layer or in a separate layer from said layer of capsules containing said internal phase.

7. The imaging system of claim 6 wherein said system further comprises in combination therewith a transfer sheet and said associated dye developer is present in a layer on the surface of said transfer sheet.

8. The imaging system of claim 6 wherein said dye developer is codeposited on said support with said capsules containing said dye precursor and said capsules containing said internal phase in the same layer or in a separate underlying layer.

9. The imaging system of claim 1 wherein said capsules containing said internal phase have a discrete capsule wall.

10. The imaging system of claim 8 wherein said capsules containing said dye precursor and said capsules containing said internal phase have a discrete capsule wall.

11. An imaging process which comprises:
    image-wise exposing to actinic radiation an imaging sheet having associated therewith a dye,
    said imaging sheet including a support having on the surface thereof a layer of capsules, said capsules containing a decolorizing agent and a photohardenable or photosoftenable radiation sensitive composition as an internal phase; and
    rupturing said capsules in the presence of said dye such that said capsules image-wise release said decolorizing agent and said decolorizing agent reacts with said dye to decolorize it and thereby form an image.

12. The imaging process of claim 11 wherein said dye is carried on said imaging sheet either in said layer of capsules containing said decolorizing agent or in a separate layer.

13. The imaging process of claim 11 wherein said dye is carried on a transfer sheet and said process further comprises, following rupturing of said capsules, image-wise transferring said decolorizing agent to said transfer sheet for said reaction with said dye which produces said image.

14. An imaging process which comprises:
   image-wise exposing an imaging sheet to actinic radiation;
   said imaging sheet including:
   a support,
   a plurality of first capsules in a layer on one surface of said support, and
   an internal phase contained in said first capsules comprising a decolorizing agent and a photohardenable or photosoftenable radiation sensitive composition,
   said imaging sheet having associated therewith a combination of a dye developer and a dye precursor which is capable of reacting to form a dye,
   rupturing said capsules on said imaging sheet in the presence of said dye developer such that said decolorizing agent is image-wise released from said capsules and imge-wise reacts with said dye developer, and
   reacting said dye precursor with said dye developer where said dye developer has not reacted with said decolorizing agent to form an image.

15. The process of claim 14 wherein said dye developer is present on the same surface of said imaging sheet as said plurality of capsules.

16. The process of claim 15 wherein said dye precursor is present on a transfer sheet and said process further comprises, after rupturing said capsules and reacting said decolorizing agent with said dye developer, transferring said dye precursor to said imaging sheet.

* * * * *